(12) United States Patent
Chang et al.

(10) Patent No.: US 11,409,339 B2
(45) Date of Patent: Aug. 9, 2022

(54) FAN MODULE AND DISPLAY CARD DEVICE HAVING THE SAME

(71) Applicant: ASUSTeK COMPUTER INC., Taipei (TW)

(72) Inventors: Chien-Lung Chang, Taipei (TW); Xu Wang, Taipei (TW); Hui He, Taipei (TW)

(73) Assignee: ASUSTEK COMPUTER INC., Taipei (TW)

( * ) Notice: Subject to any disclaimer, the term of this patent is extended or adjusted under 35 U.S.C. 154(b) by 0 days.

(21) Appl. No.: 17/030,447

(22) Filed: Sep. 24, 2020

(65) Prior Publication Data

US 2021/0103319 A1    Apr. 8, 2021

(30) Foreign Application Priority Data

Oct. 4, 2019 (TW) ................................. 108136113

(51) Int. Cl.
*G06F 1/20* (2006.01)
*H05K 5/02* (2006.01)

(52) U.S. Cl.
CPC ............. *G06F 1/20* (2013.01); *H05K 5/0226* (2013.01); *G06F 2200/201* (2013.01)

(58) Field of Classification Search
CPC ........ G01R 11/04; H05K 5/0269; H05K 7/12; H05K 7/20836; H05K 7/20172; H05K 7/20; H05K 5/03; H05K 7/20136–20209; H05K 5/0239; G06F 1/20
See application file for complete search history.

(56) References Cited

U.S. PATENT DOCUMENTS

| | | | | |
|---|---|---|---|---|
| 6,468,054 B1 * | 10/2002 | Anthony | ............. | F04D 25/12 417/360 |
| 6,587,342 B1 * | 7/2003 | Hsu | ............. | G06F 1/20 165/80.3 |
| 7,413,402 B2 * | 8/2008 | Kang | ............. | H05K 7/20172 361/695 |
| 9,036,348 B2 * | 5/2015 | Huang | ............. | G06F 1/20 361/695 |
| 9,104,385 B2 * | 8/2015 | Yang | ............. | G06F 1/185 |
| 2002/0094283 A1 * | 7/2002 | Salmen | ............. | F04D 25/0613 417/360 |

(Continued)

FOREIGN PATENT DOCUMENTS

CN   204480159 U       7/2015
CN   208271104 U   *  12/2018

(Continued)

OTHER PUBLICATIONS

Ye, Bing-sheng, Electronic Device, Dec. 21, 2018, NPL Translation Sep. 24, 2021 (Year: 2021).*

*Primary Examiner* — Michael A Matey
(74) *Attorney, Agent, or Firm* — McClure, Qualey & Rodack, LLP

(57) ABSTRACT

A fan module is provided in this disclosure. The fan module comprises a fan and a casing. The casing accommodates the fan and includes a first cover and at least one second cover, the second cover is rotatably connected with the first cover at a first location or a second location. A portion of the fan exposed by the second cover at the first location is less than that at the second location.

13 Claims, 14 Drawing Sheets

(56) References Cited

U.S. PATENT DOCUMENTS

| | | | | |
|---|---|---|---|---|
| 2006/0285291 | A1* | 12/2006 | Elkins | H05K 7/20172 361/695 |
| 2011/0134605 | A1 | 6/2011 | Chou et al. | |
| 2011/0228476 | A1* | 9/2011 | Lin | G06F 1/185 361/695 |
| 2013/0033159 | A1* | 2/2013 | Immel | F04D 29/601 312/236 |
| 2015/0116930 | A1* | 4/2015 | Yamaguchi | G06F 1/206 361/679.48 |
| 2017/0042060 | A1* | 2/2017 | Chen | F04D 29/601 |
| 2018/0277932 | A1* | 9/2018 | Martinez | H01Q 1/241 |
| 2018/0295746 | A1* | 10/2018 | Han | H05K 7/20409 |

FOREIGN PATENT DOCUMENTS

| | | |
|---|---|---|
| TW | 169065 U | 9/1991 |
| TW | M251184 U | 11/2004 |
| TW | I391813 B | 4/2013 |
| TW | I557326 B | 11/2016 |

\* cited by examiner

FAN MODULE AND DISPLAY CARD DEVICE HAVING THE SAME

CROSS-REFERENCE TO RELATED APPLICATION

This application claims the priority benefit of Taiwan applications serial No. 108136113, filed on Oct. 4, 2019. The entirety of the above-mentioned patent application is hereby incorporated by reference herein and made a part of specification.

BACKGROUND OF THE INVENTION

Field of the Invention

The invention relates to a fan module.

Description of the Related Art

The display card is one of the most basic components of a personal computer. It is mainly used to process graphic data and provide display signals, so that the displayer displays the required image. With the rapid development of technology, the current display card is required to provide three-dimensional picture calculation and graphics acceleration functions while providing display signals. However, as the workload of the display card is getting heavier, various heat sinks have emerged to the display card for effectively dissipate the generated heat.

BRIEF SUMMARY OF THE INVENTION

According to the first aspect, a fan module is provided. The fan module comprises a fan and a casing. The casing accommodates the fan and includes a first cover and at least one second cover, the second cover is rotatably connected with the first cover at a first location or a second location. A portion of the fan exposed by the second cover at the first location is less than that at the second location.

According to the second aspect, a display card device is provided. The display card device comprises a display card circuit board, a heat dissipation device, and a fan module. The heat dissipation device is disposed on the display card circuit board. The fan module is disposed on a side of the heat dissipation device away from the display card circuit board. The fan module includes a fan and a casing. The casing accommodates the fan and includes a first cover and at least one second cover, the second cover is rotatably connected with the first cover at a first location or a second location. A portion of the fan exposed by the second cover at the first location is less than that at the second location.

According to the disclosure, the casing of the fan module is separated into the first cover and the second cover. Moreover, the second cover is rotated relative to the first cover or further removed from the first cover to move between the first position (the closed state) or the second (the opening state) position. In this way, when the casing of the fan module is moved to the opening state, the airflow outside the casing smoothly flow into the casing to cool down the heat dissipation device, and then the hot air leaves through the air outlet between the second casing and the first casing, which improves the heat dissipation performance of the display card. In addition, the first cover fixed to the display card protects the users and the fan at the same time, avoiding the users from being injured by the rotating fan and the fan from being damaged by the collision of foreign objects as well.

The specific details will be described in the following embodiments and related drawings.

BRIEF DESCRIPTION OF THE DRAWINGS

These and other features, aspects and advantages of the invention will become better understood with regard to the following embodiments and accompanying drawings.

DETAILED DESCRIPTION OF THE EMBODIMENTS

Figure 1:
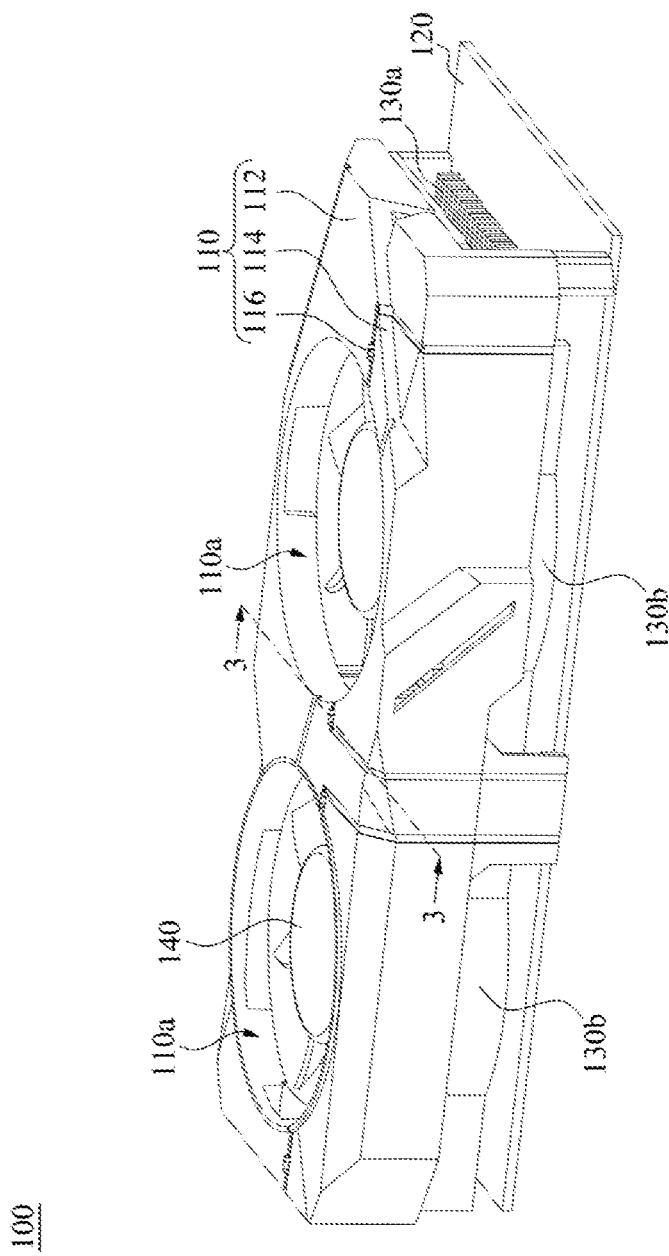
FIG. 1 is a perspective view of a display card device according to an embodiment, a second cover of a casing is at a first position (the closed state).

The embodiments of the present disclosure are disclosed in the following drawings, and for the sake of clarity, the details of the invention will be described in the following description. However, it should be understood that these practical details are not intended to limit the disclosure. That is, in some embodiments of the disclosure, these practical details are not necessary. In addition, some of the conventional structures and elements are shown in the drawings in a simplified schematic manner in order to simplify the drawings. The thickness of layers and regions in the drawings may be exaggerated for clarity and the same elements in the description of the drawings represent the same elements.

Figure 2:
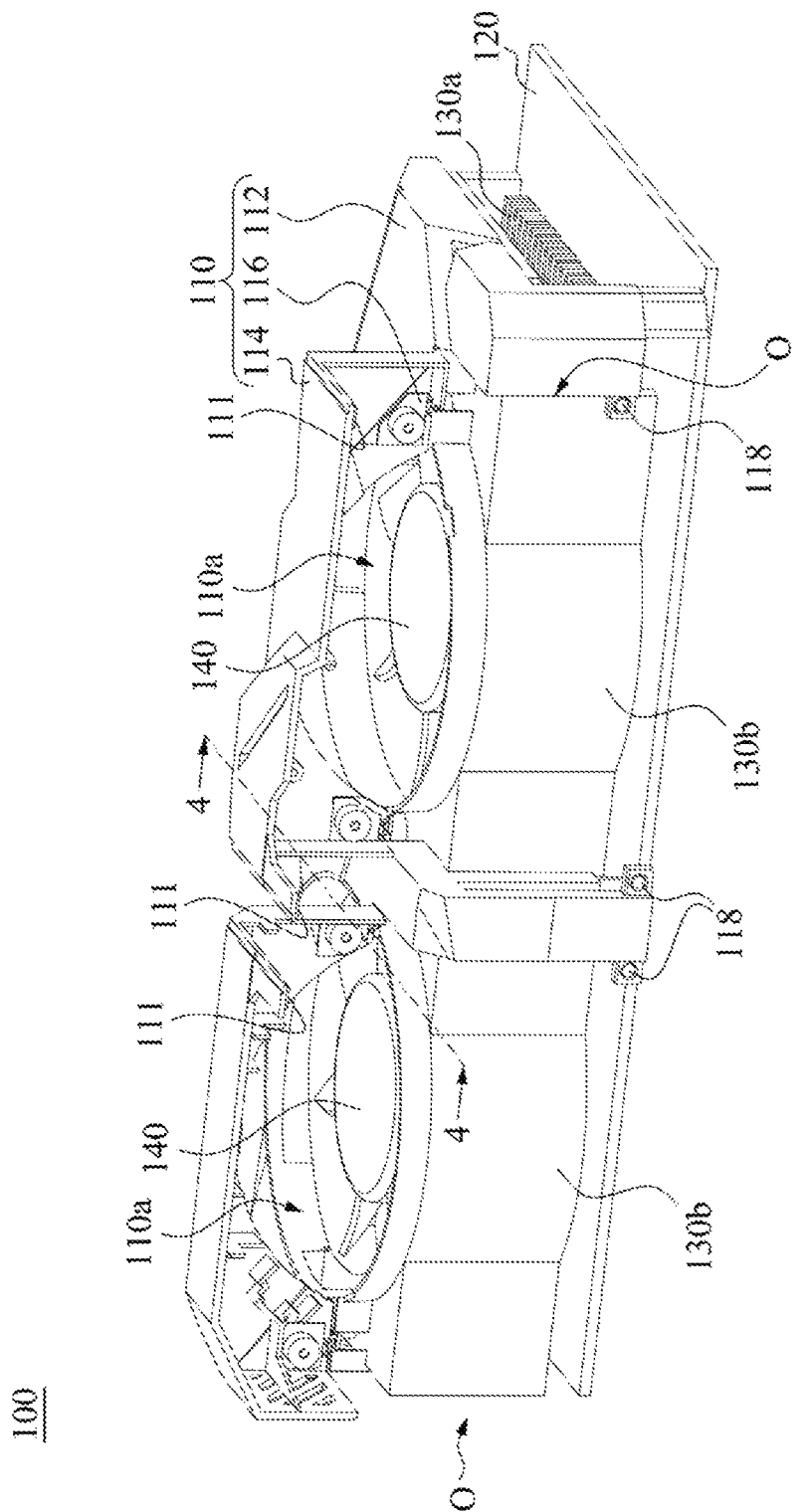
FIG. 2 is a perspective view of the display card device of FIG. 1, the second cover of the casing is at a second position (the opening state).

Please refer to FIG. 1 and FIG. 2. FIG. 1 is a perspective view showing a display card device 100 according to an embodiment, in which the second cover 114 of the fan module 110 is at a first position, that is, a closed state. FIG. 2 is a perspective view of the display card device 100 of FIG. 1, in which the second cover 114 of the fan module 110 is at the second position, that is, an opened state. For a clear perspective view, the fan module 110 in FIG. 2 is opened to expose a portion of the fan 140.

As shown in FIG. 1, the display card device 100 includes a display card circuit board 120 (hereinafter referred to as a circuit board), a first heat dissipation device 130a, a second heat dissipation device 130b, and a fan module. The fan module includes a fan 140 and a casing 110. The first heat dissipation device 130a and the second heat dissipation device 130b are disposed on the circuit board 120 to dissipate the heat of the circuit board 120. The fan 140 is disposed on the other side of the first heat dissipation device 130a and the second heat dissipation device 130b opposite to the circuit board 120, to dissipate the heat of the first heat dissipation device 130a and the second heat dissipation device 130b received from the circuit board 120 and cool down the first heat dissipation device 130a and the second heat dissipation device 130b. The casing 110 accommodates a fan 140 and covers the first heat dissipation device 130a and the second heat dissipation device 130b. Specifically, the casing 110 has an opening 110a. The fan 140 is exposed through the opening 110a to facilitate internal and external air flow. The casing 110 is configured to protect the fan 140 from being damaged by external objects. At the same time, the casing 110 protects the users from accidentally being injured by the fan 140 during rotation.

In one embodiment, the casing 110 includes a first cover 112, a second cover 114, and a hinge 116. The second cover 114 is disposed adjacent to the first cover 112 and commonly forms the opening 110a. In an embodiment, the second cover 114 is rotatably connected to the first cover 112 through the hinge 116, so that the casing 110 is moved at the first position (that is the closed state as shown in FIG. 1) or at the second position (that is the opened state as shown in FIG. 2). The portion of the fan 140 exposed at the first position is less than that at the second position.

When the display card device 100 is under operating, the electronic components on the circuit board 120 generate a large amount of heat. The first heat dissipation device 130a and the second heat dissipation device 130b absorb the heat generated by the electronic components on the circuit board 120, so that the temperatures of the first heat dissipation device 130a and the second heat dissipation device 130b rise. At this time, by the rotation of the fan 140, the air outside the casing 110 is sucked into the casing 110 through the opening 110a, and further flows through the first heat dissipation device 130a and the second heat dissipation device 130b to utilize the cold air outside the casing 110 to cool down the first heat dissipation device 130a and the second heat dissipation device 130b. When the casing 110 is at the first position, (that is in the closed state), the hot air flowing through the first heat dissipation device 130a and the second heat dissipation device 130b is blocked by the casing 110, and therefore the hot air is difficult to flow out from the casing 110, which decreases the heat dissipation efficiency of the first heat dissipation device 130a and the second heat dissipation device 130b. However, the second cover 114 is rotatably connected to the first cover 112 through the hinge 116. Thus, when the second cover 114 rotates relative to the first cover 112 and is partially away from the first cover 112, the first cover 112 and the second cover 114 form an outlet O (as shown in FIG. 2). Thereby, the hot air flows out from the outlet O and the cold air flows into the casing 110, which greatly improves the heat dissipation performance of the first heat dissipation device 130a and the second heat dissipation device 130b.

In one embodiment, the first heat dissipation device 130a and the second heat dissipation device 130b are the same heat dissipating element. In one embodiment, the first heat dissipation device 130a and the second heat dissipation device 130b are different heat dissipation elements (for example, the fin arrangement directions of the first heat dissipation device 130a and the second heat dissipation device 130b are perpendicular to each other). In one embodiment, the first heat dissipation device 130a and the second heat dissipation device 130b are radiating fins, which is not limited herein.

Furthermore, the casing 110 further includes a first fixing element 118 and a second fixing element 111. The first fixing element 118 is disposed on the first cover 112. The second fixing element 111 is disposed on the second cover 114. When the casing 110 is in the closed state, the second fixing element 111 overlaps with the first fixing element 118. Therefore, when the casing 110 is in the closed state, the first cover 112 and the second cover 114 is fixed by the first fixing element 118 and the second fixing element 111 to ensure that the second cover 114 does not separate from the first cover 112 in the closed state, which prevents dust from entering the casing 110, and protects the fan 140, the first heat dissipation device 130a, and the second heat dissipation device 130b from being hit outside objects.

Specifically, the first fixing element 118 and the second fixing element 111 are magnetically fixed to each other. In one embodiment, the first fixing element 118 and the second fixing element 111 are magnetic elements with two different magnetic poles respectively. In one embodiment, one of the first fixing element 118 and the second fixing element 111 is a magnetic element, and the other one includes a ferromagnetic material, which is not limited herein. In this way, when the casing 110 is closed, the first fixing element 118 and the second fixing element 111 are fixed by magnetic attraction.

In other embodiments, the first fixing element 118 and the second fixing element 111 are complementary buckle structures. In other words, the first cover 112 and the second cover 114 are fixed to each other by mutual engagement, which is not limited herein.

In some embodiments, the number of the first fixing element 118 and the second fixing element 111 is one or more. In other embodiments, the first fixing element 118 and the second fixing element 111 are respectively disposed on the side walls of the first cover 112 and the second cover 114 adjacent to outlet O, which is not limited herein. In other words, the numbers, shapes, and positions of the first fixing element 118 and the second fixing element 111 are adjustable according to the actual operating conditions, which is not limited to those shown in FIG. 2.

Figure 3:
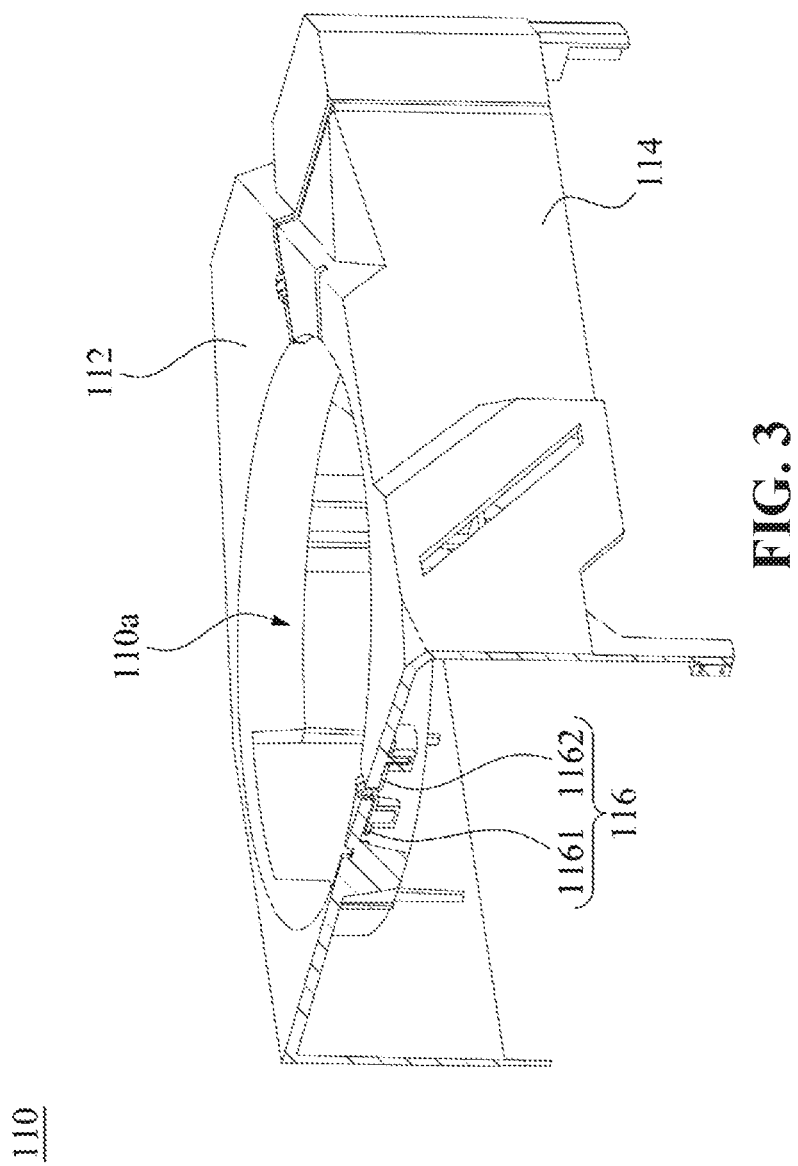
FIG. 3 is a three-dimensional sectional view of the casing along line segment 3-3 in FIG. 1.
Figure 4:
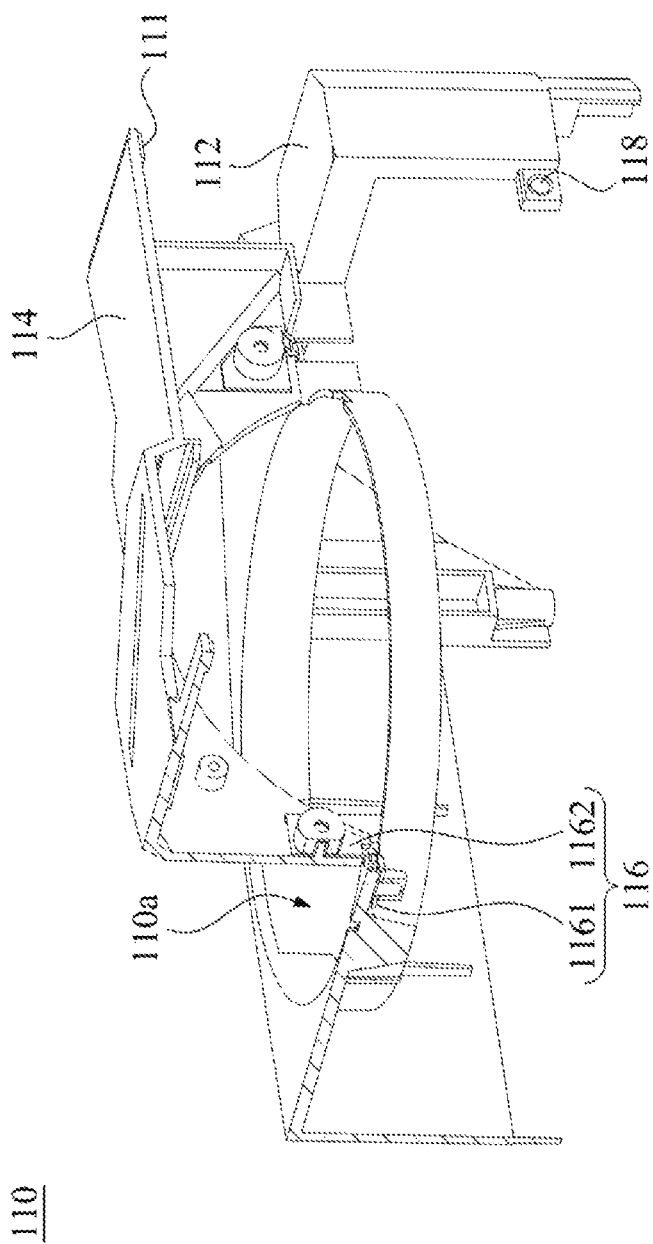
FIG. 4 is a three-dimensional sectional view of the casing along line segment 4-4 in FIG. 2.

Please refer to FIG. 3 and FIG. 4. FIG. 3 is a three-dimensional cross-sectional view showing the casing 110 of the fan module in FIG. 1 along line segment 3-3. FIG. 4 is a three-dimensional cross-sectional view showing the casing 110 of the fan module in FIG. 4 along line segment 4-4.

The hinge 116 includes a first connecting part 1161 and a second connecting part 1162. The first connecting part 1161 and the second connecting part 1162 are rotatably connected with each other. Furthermore, the first connecting part 1161 is fixed to the first cover 112, and the second connecting part 1162 is fixed to the second cover 114. Therefore, when the second connecting part 1162 rotates relative to the first connecting part 1161, the second connecting part 1162 causes the second cover 114 to rotate relative to the first cover 112, so that the casing 110 is at the first position (that is at the closed state shown in FIG. 3) or moved to the second position (as shown in FIG. 4) as required.

In one embodiment, the first connecting part 1161 and the second connecting part 1162 are fixedly connected to the first cover 112 and the second cover 114 respectively by locking elements such as screws. In an embodiment, when the locking elements are removed, the second connecting part 1162 and the second cover 114 is detachably connected.

Figure 5:
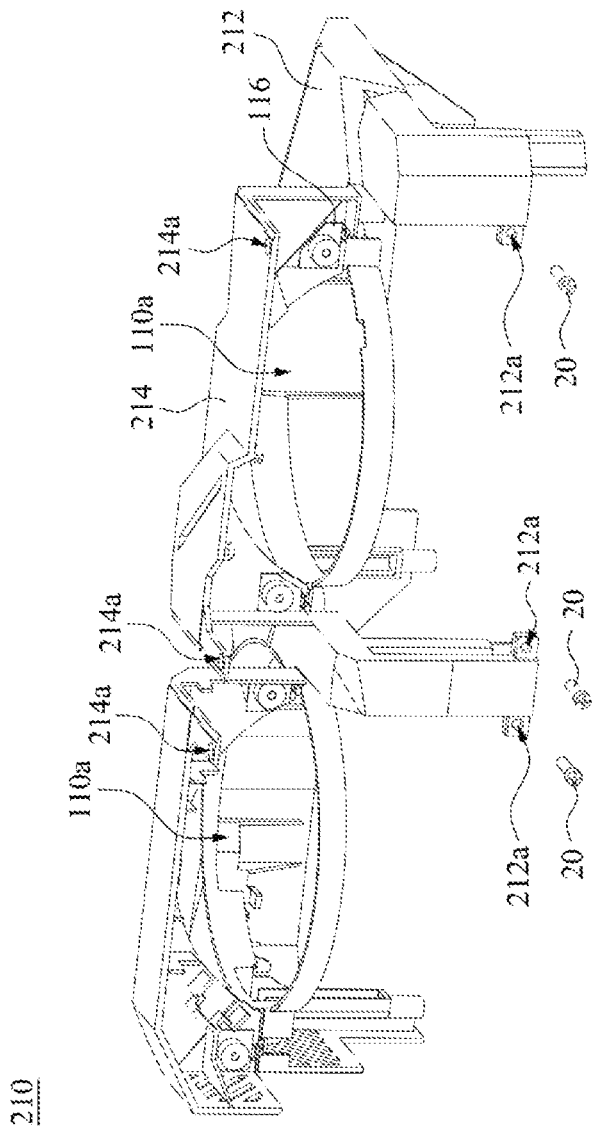
FIG. 5 is a perspective view of the casing of another embodiment, in which the second cover is at the second position (the opening state).
Figure 6:
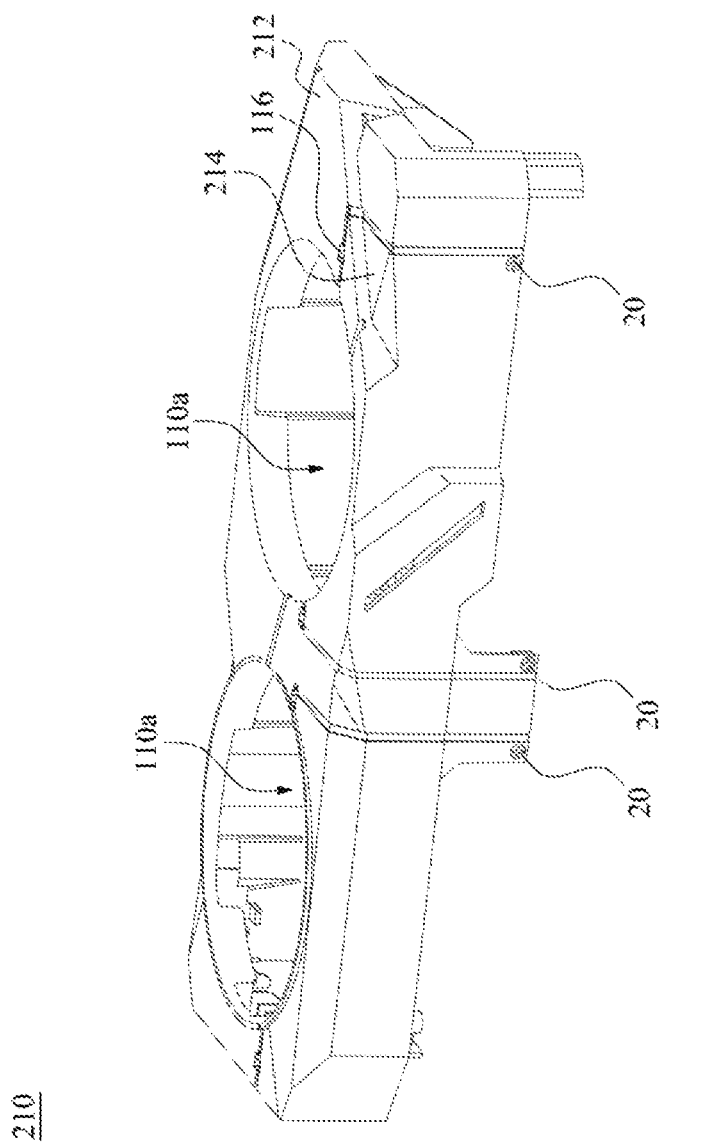
FIG. 6 is a perspective view of the casing in FIG. 5 with the second cover at first position (the closed state).

Please refer to FIG. 5 and FIG. 6. FIG. 5 is a perspective view of a casing 210 according to another embodiment, in which the second cover 214 is at the second position (that is at the opening state), and the first cover 212 and the second cover 214 respectively include a first screwing hole 212*a* and a second screwing hole 214*a*. FIG. 6 is a perspective view of the casing 210 in FIG. 5 with the second cover 214 at the first position (that is at the closed state).

As shown in FIG. 5, in this embodiment, the casing 210 includes a first cover 212, a second cover 214, and a hinge 116. The hinge 116 is the same as which in the embodiments shown in FIG. 1 to FIG. 4. Therefore, the foregoing description is referred to and is not repeated here. Practically, the difference between this embodiment shown in FIG. 5 and the embodiments shown in FIG. 1 to FIG. 4 lies in that the first cover 212 shown in FIG. 5 has a first screwing hole 212*a*, and the second cover 214 has a second screwing hole 214*a*. When the casing 210 is in the closed state, the first screwing hole 212*a* and the second screwing hole 214*a* overlap and interconnected, so that the fixing component 20 passes through the first screwing hole 212*a* and the second screwing hole 214*a* (as shown in FIG. 6), thereby fixing the first cover 212 and the second cover 214 to each other. In this way, the second cover 214 is avoided from being separated due to rotation relative to the first cover 212 in the closed state, which prevents dust from entering the casing 210, and protects the fan 140, the first heat dissipation device 130*a* and the second heat dissipation device 130*b* from being hit by outside objects.

In some embodiments, at least one of the first screwing hole 212*a* and the second screwing hole 214*a* has an internal thread, and the fixing component 20 is a screw. The fixing component 20 is screwed into the first screwing hole 212*a* and the second screwing hole 214*a* and engaged with the internal threads of the first screwing hole 212*a* or the second screwing hole 214*a*, to fix the first cover 212 and the second cover 214, which is not limited herein. Any locking mechanisms or components that fix the first cover 212 and the second cover 214 together are also adapted.

Figure 7:
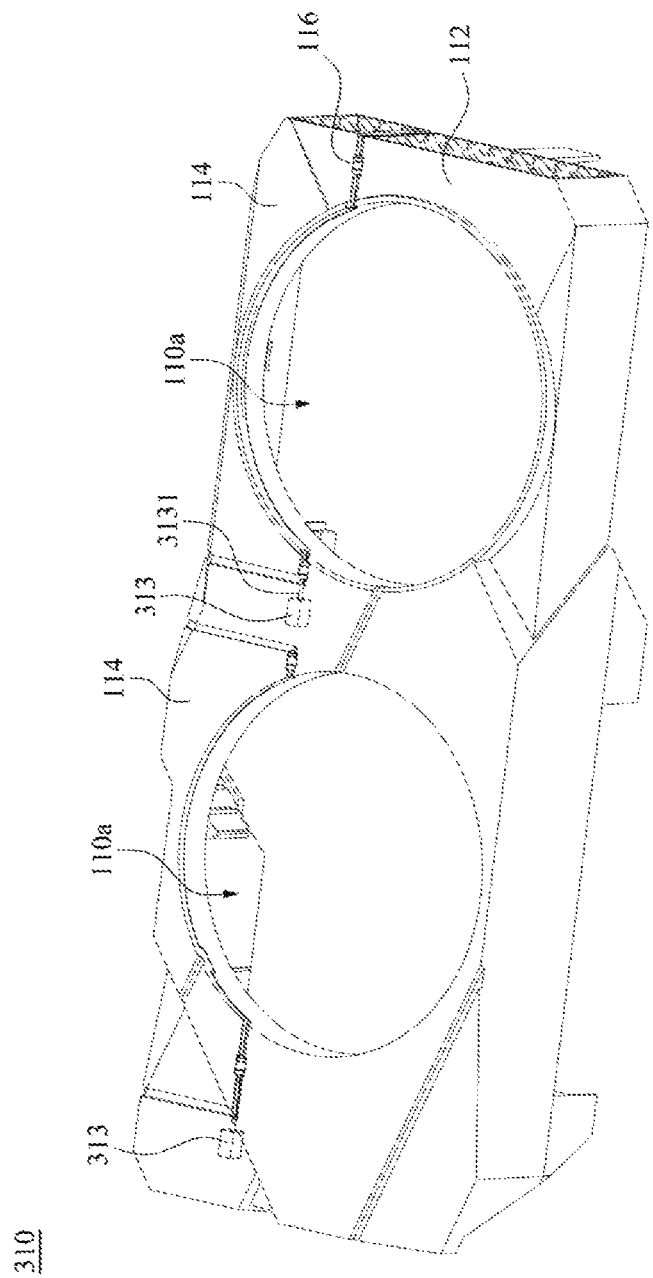
FIG. 7 is a perspective view of the casing of another embodiment, in which the second cover is at the first position (the closed state).
Figure 8:
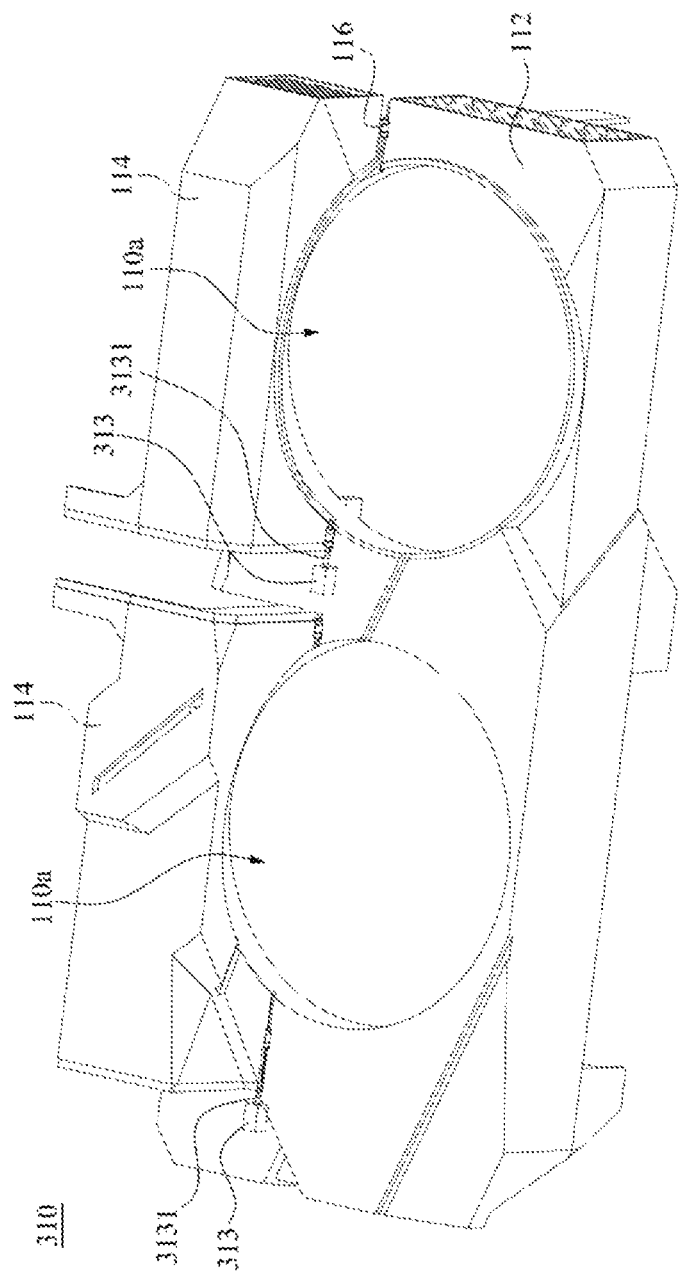
FIG. 8 is a perspective view of the casing in FIG. 7, in which the second cover is at the second position (the opening state).

Please refer to FIG. 7 and FIG. 8. FIG. 7 is a perspective view of a casing 310 according to another embodiment. The second cover 114 is at a first position (that is at the closed state), and the casing 310 further includes a driver 313. FIG. 8 is a perspective view of the casing 310 in FIG. 7, in which the second cover 114 is at the second position (that is at the opening state).

As shown in FIG. 7 and FIG. 8, in this embodiment, the casing 310 includes a first cover 112, a second cover 114, a hinge 116, and the driver 313. The first cover 112, the second cover 114, and the hinge 116 are the same as those in the foregoing embodiment. Therefore, the foregoing related description is referred to and is not repeated here. The difference between this embodiment and the foregoing embodiment is that the casing 310 in this embodiment further includes a driver 313. The driver 313 is disposed on the first cover 112, adjacent to the junction between the first cover 112 and the second cover 114. The driver 313 includes a driving shaft 3131. The driving shaft 3131 is coupled to the second cover 114. In this way, when the driver 313 is operating, the driving shaft 3131 rotates to drive the second cover 114 relative to the first cover 112, and away from the first cover 112, so that the casing 310 is moved to the closed state or the opening state by the motor rotation.

Figure 9:
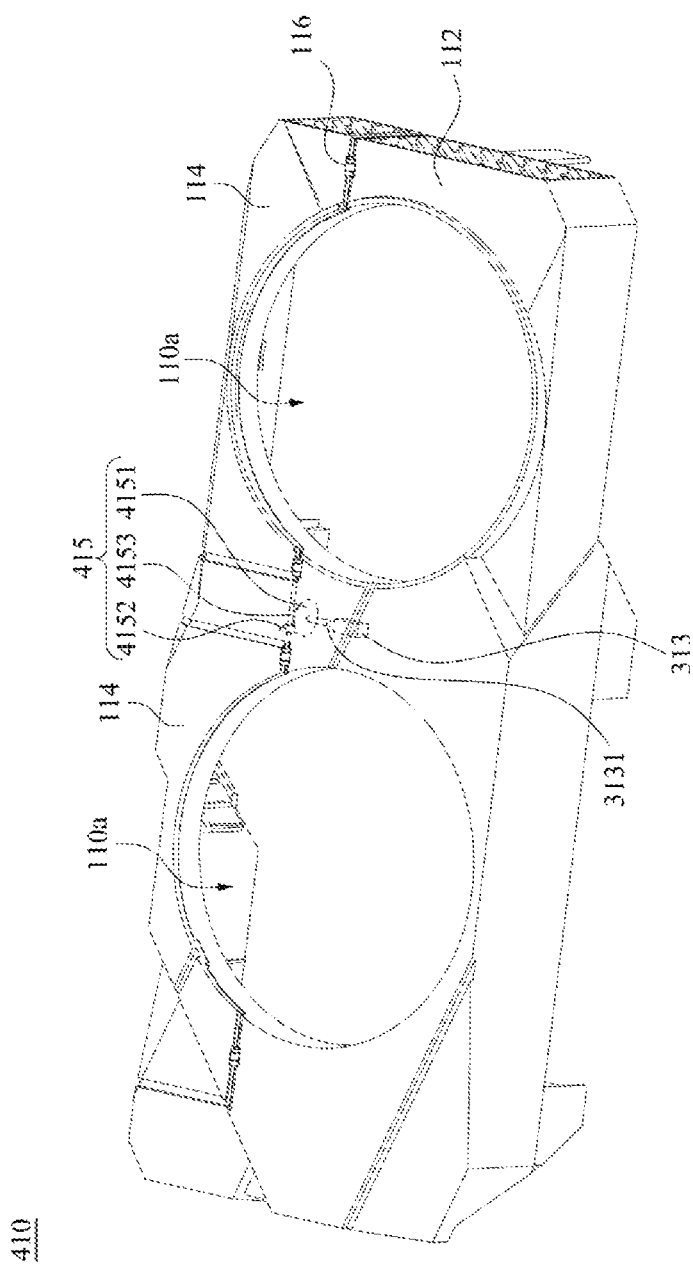
FIG. 9 is a perspective view of the casing of another embodiment of the present case, in which the second cover is at the first position (the closed state), and the casing further includes a transmission module.
Figure 10:
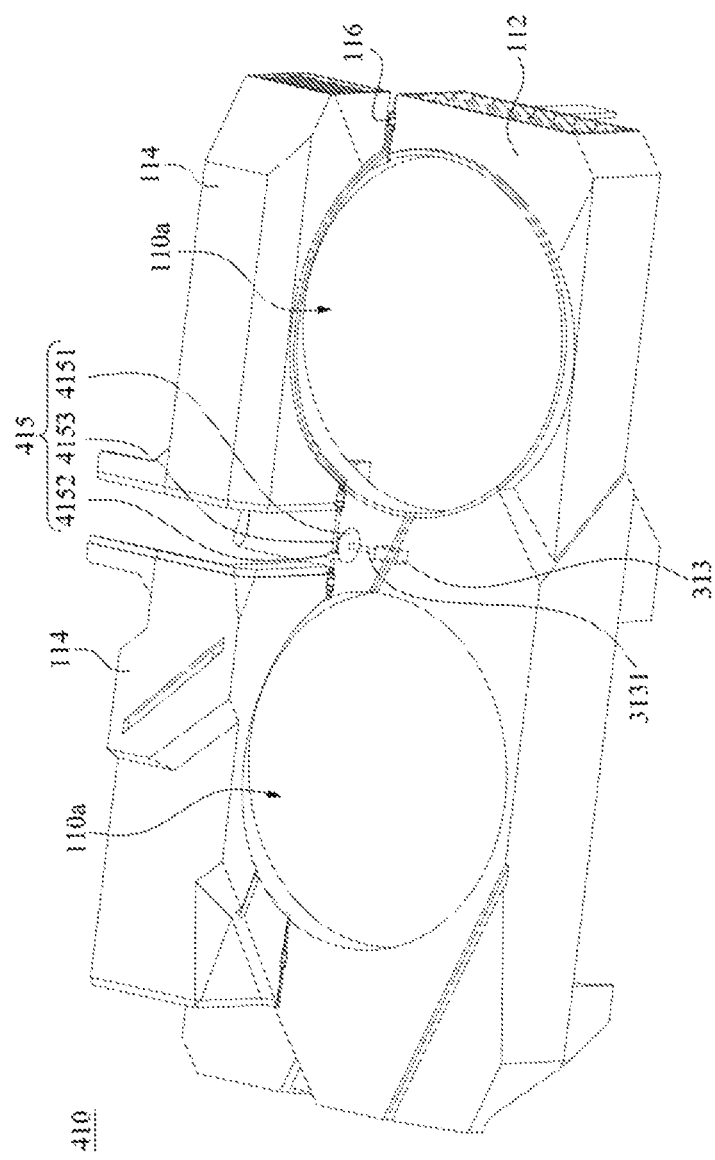
FIG. 10 is a perspective view of the casing in FIG. 9, in which the second cover is at the second position (the opening state).

Please refer to FIG. 9 and FIG. 10. FIG. 9 is a perspective view of a casing 410 according to another embodiment. The second cover 114 is at a first position (that is in the closed state), and the casing 410 further includes a transmission module 415. FIG. 10 is a perspective view showing the casing 410 in FIG. 9, in which the second cover 114 at the second position (that is in the opening state).

As shown in FIG. 9 and FIG. 10, in this embodiment, the casing 410 includes a first cover 112, a second cover 114, a hinge 116, a driver 313, and a transmission module 415. The first cover 112, the second cover 114, and the hinge 116 are the same as those in the previous embodiment, so reference is made to the foregoing related description, which is not repeated here. The difference between this embodiment and the foregoing embodiment is that the casing 410 of this embodiment further includes a transmission module 415. The transmission module 415 includes a driving gear 4151, a driven gear 4152, and a shaft rod 4153. The driving shaft 3131 of the driver 313 is connected to the driving gear 4151. The driven gear 4152 engages with the driving gear 4151. The shaft rod 4153 is connected to the driven gear 4152 and the second cover 114. With the structural configuration of the embodiments shown in FIG. 9 and FIG. 10, when the driver 313 is operating, the rotating shaft 3131 rotates the driving gear 4151 and the driven gear 4152, and then drives the shaft rod 4153 and the second cover 114, so that the casing 410 is moved to the closed or opening state by the rotation of the motor.

In some embodiments, the driver 313 is an electric motor. In some embodiments, the driven gear 4152 is a bevel gear, and the driving gear 4151 is a crown gear. In other embodiments, both driven gear 4152 and driving gear 4151 are bevel gears, which is not limited herein.

In the embodiments shown in FIG. 7 to FIG. 10, the driver 313 is set by a program to operate in a specific situation, to move the casing 310 to a closed state or an opening state. For example, the driver 313 operates with a temperature detector installed in the casing 310/410, on the circuit board 120, or on a component carrying the circuit board 120. When the detector detects that the temperature in the casing 310/410 is too high, the driver 313 drives the driving shaft 3131 to rotate along a rotation direction and moves the casing 310/410 to the opening state. When the temperature in the casing 310/410 is not high, the driver 313 drives the driving shaft 3131 to rotate along the other rotation direction, and the casing 310/410 moves to the closed state. In some embodiments, the driver 313 is controlled by computer software or set to drive the driving shaft 3131 to rotate along the corresponding direction every predetermined period of time, so that the casing 310/410 is timed to move to the opening state or the closed state, which is not limited herein. With the embodiments shown in FIG. 7 to FIG. 10, the casing 310 automatically moves to the closed state or the opening state according to the use situation of the display card device 100. In this way, not only the heat dissipation performance of the display card device 100 is improved, but also the convenience of use of the casing 310/410 is enhanced.

Figure 11:
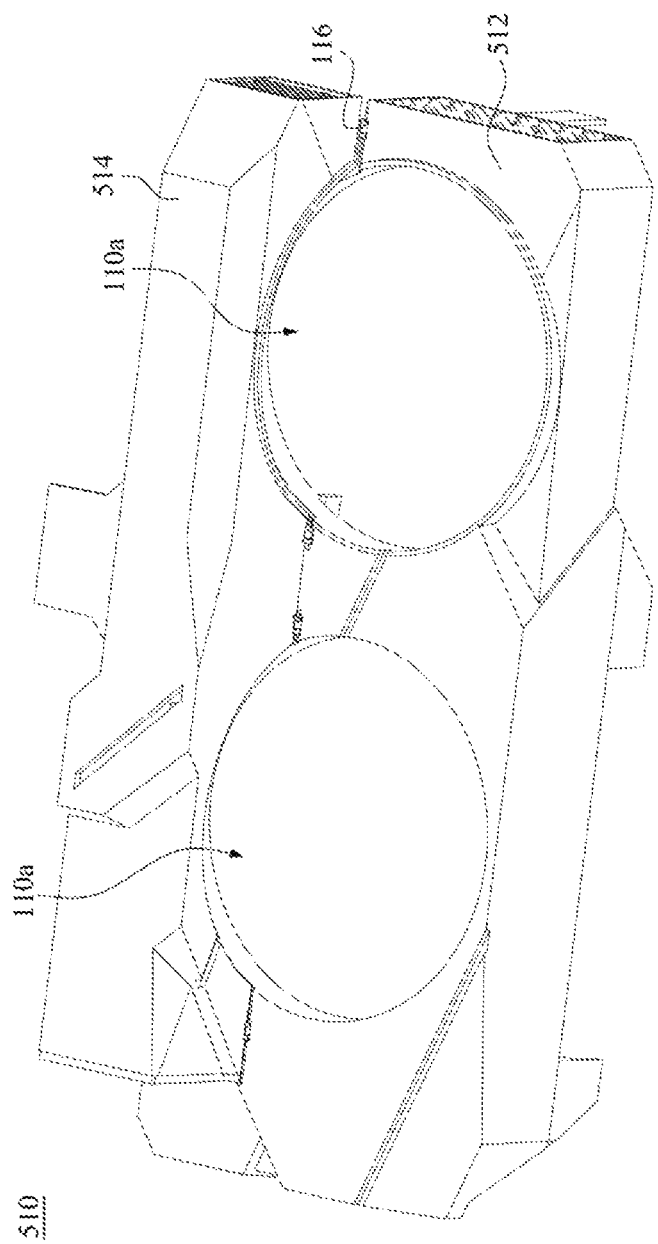
FIG. 11 is a perspective view of a casing according to another embodiment.

Please refer to FIG. 11. FIG. 11 is a perspective view of a casing 510 according to another embodiment, in which the second cover 514 is a one-piece.

As shown in FIG. 11, in this embodiment, the casing 510 includes a first cover 112, a second cover 514, and a hinge 116. The first cover 112 and the hinge 116 are the same as the embodiment shown above, so reference is made to the foregoing, related descriptions are not repeated here. The difference between this embodiment and the foregoing embodiment lies in that the second cover 514 of this embodiment is one-piece. Specifically, in the foregoing embodiment, the casing 110/210/310/410 has two second covers 114/214 and two opening 110a. Each second cover 114/214 corresponds to an opening 110a setting, and a portion of the first cover 112 is set between the two second cover 114/214. However, in this embodiment, the one-piece second cover 514 is regarded as a structure formed by connecting two second covers 114/214. In this way, the outlet O between the first cover 112 and the second cover 514 is enlarged (not shown because of the viewing angle), so that the air flow flowing inside and outside the casing 510 is improved, and the heat dissipation performance of the display card device 100 is further improved.

Figure 12:
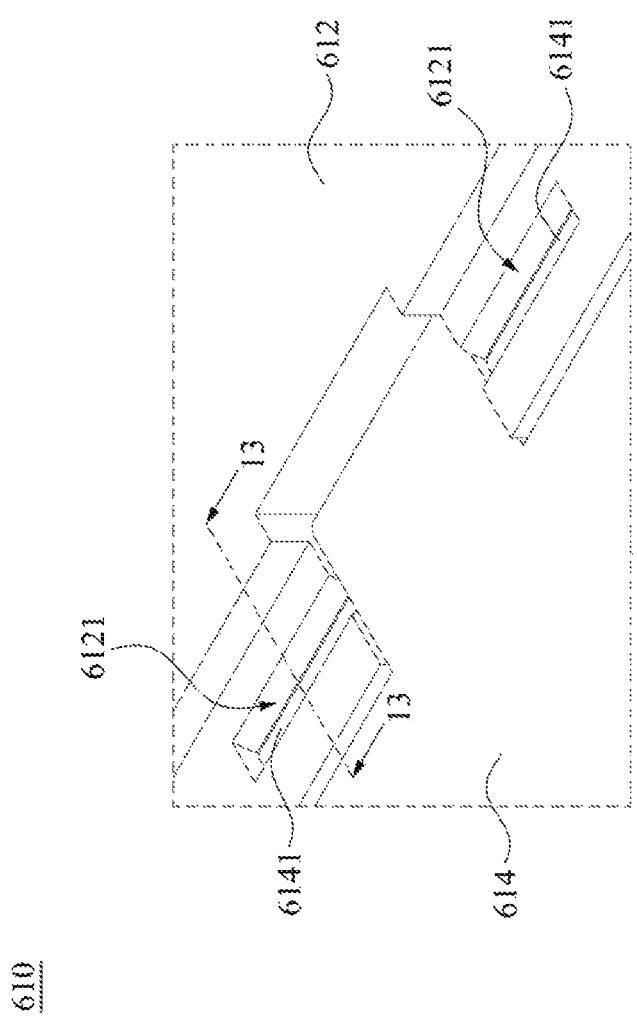
FIG. 12 is a partially enlarged view of the casing according to another embodiment.
Figure 13:
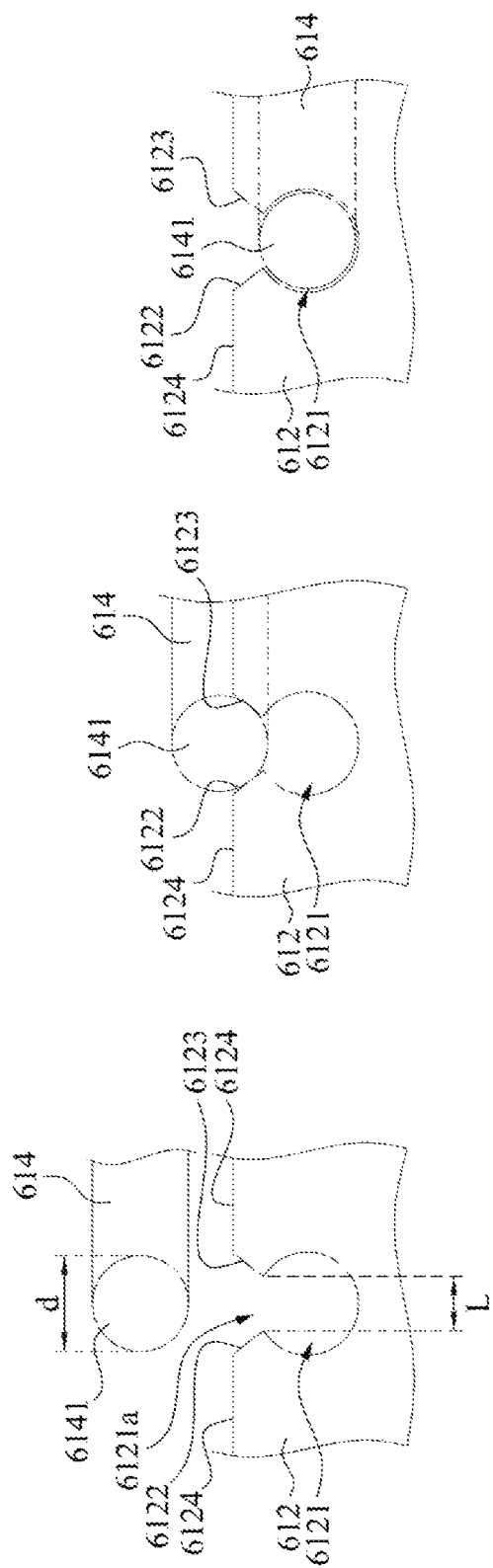
FIG. 13A to FIG. 13C are schematic sectional views of the assembly of FIG. 12 along the line segment 13-13.
Figure 14:
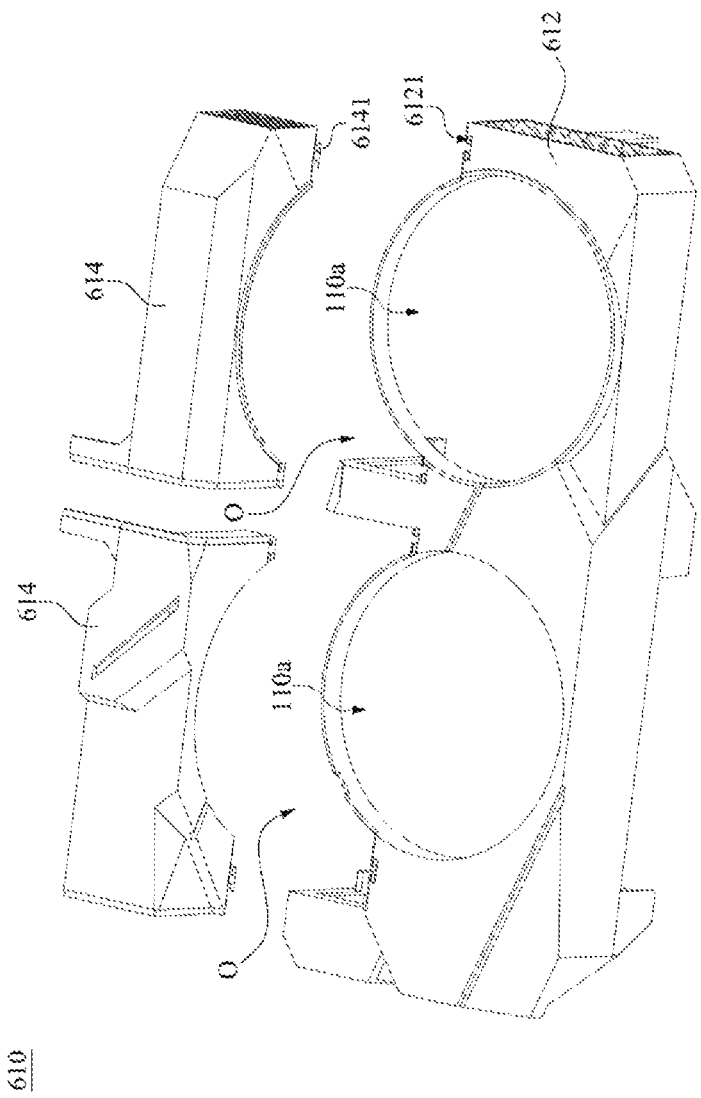
FIG. 14 is a schematic view of the second case in FIG. 12 after being disassembled from the first case.

Please refer to FIG. 12 to FIG. 14. FIG. 12 is a partially enlarged view of a casing 610 according to another embodiment. FIG. 13A to FIG. 13C are schematic sectional views showing the assembly of the casing 610 of FIG. 12 along line segments 13-13. FIG. 14 is a diagram showing the disassembly of the second cover 614 from the first cover 612 in FIG. 12.

As shown in FIG. 12, in the present embodiment, the fan module 610 includes a first cover 612 and a second cover 614. The difference between this embodiment and the foregoing embodiments is that the second cover 614 of this embodiment is detachably and rotatably connected to the first cover 612. Specifically, the first cover 612 includes a connecting slot 6121. The second cover 614 includes a connecting shaft 6141. The connecting shaft 6141 is detachably and rotatably connected to the connecting slot 6121.

Please refer to FIG. 13A to FIG. 13C. The first cover 612 includes a first guiding surface 6122 and a second guiding surface 6123. The first guiding surface 6122 is opposite to the second guiding surface 6123. One end of the first guiding surface 6122 and one end of the second guiding surface 6123 are connected to the connecting slot 6121. The other end of the first guiding surface 6122 and the other end of the second guiding surface 6123 are connected to the top surface 6124 of the first cover 612, so that the connecting slot 6121 has an opening 6121a. The distance between the first guiding surface 6122 and the second guiding surface 6123 gradually decreases from the top surface 6124 to the connecting slot 6121. The distance L between the ends of the first guiding surface 6122 and the second guiding surface 6123 which are adjacent to the connecting slot 6121 is smaller than the diameter D of the connecting shaft 6141. To engage the second cover 614 with the first cover 612, the users press the connecting shaft 6141 into the opening 6121a, and the opening 6121a elastically deforms due to being compressed by the connecting shaft 6141 when the connecting shaft 6141 is pressed, so that the connecting shaft 6141 enters the connecting slot 6121. The connecting slot 6121 has an arc-shaped slot surface that matches the shape of connecting shaft 6141. In this way, the connecting shaft 6141 rotates in the connecting slot 6121. With the configuration of the connecting slot 6121 and the connecting shaft 6141, the second cover 614 rotates relative to the first cover 612, so that the casing 610 is moved to the closed or opening state. Moreover, since the distance L between the ends of the first guiding surface 6122 and the second guiding surface 6123 which are adjacent to the connecting slot 6121 is smaller than the diameter D of the connecting shaft 6141, which avoids the connecting shaft 6141 from falling out of the connecting slot 6121.

Furthermore, when the second cover 614 is to be removed from the first cover 612, the users only need to apply force to pull the connecting shaft 6141 away from the connecting slot 6121, so that the connecting shaft 6141 presses the opening 6121a. After the opening 6121a elastically deforms, the connecting shaft 6141 is separated from the connecting slot 6121 through the opening 6121a, so that the second cover 614 is removed from the first cover 612, as shown in FIG. 14.

In some embodiments, the first cover includes a connecting shaft, and the second cover includes a connecting slot. The connecting slot of the second cover is detachably and rotatably connected with the connecting shaft of the first cover, which is not limited herein.

In the embodiments shown in the FIG. 12 to FIG. 14, when the second cover 614 is rotated relative to the first cover 612 and away from the first cover 612, but the temperature in the casing 610 is still high, remove the second cover 614 from the first cover 612 to further increase the outlet O to increase air flow volume and improve the heat dissipation performance of the display card device 100, making the display card device 100 operate more smoothly.

The casing shown in FIG. 5 to FIG. 14 is applied to the display card device 100 shown in FIG. 1 and FIG. 2, which is not limited herein.

From the above detailed description of the embodiment, it is clearly seen that the fan module applied to the display card device includes the first cover and the second cover. The second cover is rotated relative to the first cover or removed from the first cover, so that the fan module is moved between the first position (the closed state) and the second position (the opened state). In this way, when the heating of the display card gradually rises, the casing of the fan module is moved to the opening state, so that the airflow outside the casing flows into the casing to cool the heat dissipation device, and the hot air leaves the casing from the outlet between the second cover and the first cover. This improves the heat dissipation performance of the display card. In addition, the first cover fixed to the display card protects the users and the fan at the same time, avoiding the users being injured by the rotating fan, and the fan is not damaged by the collision of foreign objects.

Although the present invention has been described in considerable detail with reference to certain preferred embodiments thereof, the disclosure is not for limiting the scope. Persons having ordinary skill in the art may make various modifications and changes without departing from the scope. Therefore, the scope of the appended claims should not be limited to the description of the preferred embodiments described above.

What is claimed is:

1. A fan module, comprising: a fan; a casing, accommodating the fan and including a first cover and at least one second cover, the second cover is rotatably connected with the first cover at a first location or a second location; and a driver, disposed on the first cover and including a driving shaft, wherein the driving shaft is in contact with the second cover to automatically move the second cover is moved from the first location to the second location, wherein, a portion of the fan exposed by the second cover at the first location is less than that at the second location, wherein the first cover comprises a first screwing hole, the second cover comprises a second screwing hole, the first screwing hole and the second screwing hole are interconnected when the second cover is at the second location, and the first screwing hole and the second screwing hole are moved away from each other when the second cover is moved from the second location to the first location.

2. The fan module according to claim 1, further comprising a hinge, the hinge includes a first connecting part and a second connecting part rotatably connected with each other, the first connecting part and the second connecting part are respectively attached to the first cover and the second cover.

3. The fan module according to claim 1, wherein one of the first cover and the second cover includes a connecting slot, the other one of the first cover and the second cover includes a connecting shaft, the connecting shaft is detachably and rotatably connected with the connecting slot.

4. The fan module according to claim 1, further comprising a transmission module for connecting the driving shaft with the second cover, the transmission module includes:
    a driving gear, connected with the driving shaft;
    a driven gear, engaged with the driving gear; and
    a shaft rod, connected to the driven gear and the second cover.

5. A display card device, comprising:
    a display card circuit board;
    a heat dissipation device, disposed on the display card circuit board; and
    a fan module, disposed on a side of the heat dissipation device away from the display card circuit board, the fan module including:
    a fan; and
    a casing, accommodating the fan and including a first cover and at least one second cover, the second cover is rotatably connected with the first cover at a first location or a second location;
    wherein, a portion of the fan exposed by the second cover at the first location is less than that at the second location.

6. The display card device according to claim 5, wherein the fan module further comprises a hinge, the hinge includes a first connecting part and a second connecting part rotatably connected with each other, and the first connecting part and the second connecting part are respectively attached to the first cover and the second cover.

7. The display card device according to claim 5, wherein one of the first cover and the second cover includes a connecting slot, the other one of the first cover and the second cover includes a connecting shaft, the connecting shaft is detachably and rotatably connected with the connecting slot.

8. The display card device according to claim 5, wherein the fan module further comprises:
    a first fixing element, disposed on the first cover; and
    a second fixing element, disposed on the second cover, and the first cover and the second cover are fixed by the first fixing element and the second fixing element when the second cover is at the second location.

9. The display card device according to claim 8, wherein the first fixing element and the second fixing element are magnetically fixed to each other.

10. The display card device according to claim 5, wherein the first cover comprises a first screwing hole, the second cover includes a second screwing hole , and the first screwing hole and the second screwing hole are interconnected when the second cover is at the second location.

11. The display card device according to claim 5, further comprises a driver, the driver is disposed on the first cover and includes a driving shaft, the driving shaft is connected with the second cover.

12. The display card device according to claim 11, wherein the fan module further comprises a transmission module, for connecting the driving shaft with the second cover, the transmission module includes:
    a driving gear, connected with the driving shaft;
    a driven gear, engaged with the driving gear; and
    a shaft rod, connected to the driven gear and the second cover.

13. A fan module, comprising:
    a fan;
    a casing, accommodating the fan and including a first cover and at least one second cover, the second cover is rotatably connected with the first cover at a first location or a second location; and
    a driver, disposed on the first cover and including a driving shaft; and
    a transmission module for connecting the driving shaft with the second cover, the transmission module including:
    a driving gear, connected with the driving shaft;
    a driven gear, engaged with the driving gear; and
    a shaft rod, connected to the driven gear and the second cover;
    wherein, a portion of the fan exposed by the second cover at the first location is less than that at the second location.

* * * * *